US010854653B2

(12) United States Patent
Micinski et al.

(10) Patent No.: US 10,854,653 B2
(45) Date of Patent: Dec. 1, 2020

(54) IMAGING SYSTEMS WITH IMPROVED NEAR-INFRARED DETECTION PIXELS

(71) Applicant: SEMICONDUCTOR COMPONENTS INDUSTRIES, LLC, Phoenix, AZ (US)

(72) Inventors: Stanley Micinski, Meridian, ID (US); Swarnal Borthakur, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/460,715

(22) Filed: Jul. 2, 2019

(65) Prior Publication Data

US 2020/0328243 A1 Oct. 15, 2020

Related U.S. Application Data

(60) Provisional application No. 62/832,043, filed on Apr. 10, 2019.

(51) Int. Cl.
*H01L 27/146* (2006.01)
(52) U.S. Cl.
CPC .. *H01L 27/14629* (2013.01); *H01L 27/14603* (2013.01); *H01L 27/14621* (2013.01); *H01L 27/14627* (2013.01); *H01L 27/14649* (2013.01)
(58) Field of Classification Search
None
See application file for complete search history.

(56) References Cited

U.S. PATENT DOCUMENTS

| 2008/0099804 | A1  | 5/2008  | Venezia et al. |
|---|---|---|---|
| 2012/0261784 | A1* | 10/2012 | Roy ............... H01L 27/1464 257/447 |
| 2015/0340391 | A1  | 11/2015 | Webster |
| 2017/0025467 | A1  | 1/2017  | Haddad et al. |
| 2017/0133420 | A1* | 5/2017  | Silsby .............. H01L 27/14634 |
| 2018/0006072 | A1* | 1/2018  | Roy ................ H01L 27/14627 |

* cited by examiner

*Primary Examiner* — Cheung Lee
(74) *Attorney, Agent, or Firm* — Treyz Law Group, P.C.; David K. Cole

(57) ABSTRACT

An imaging device may have an array of image sensor pixels that includes infrared image pixels. Backside and frontside reflectors may be incorporated into the infrared pixels to increase effective thicknesses of photosensitive regions within the pixels. In other words, light incident on each pixel may be reflected and traverse the photosensitive region multiple times, thereby allowing silicon in the photosensitive region to absorb infrared light more efficiently. The backside reflector may be interposed between the silicon and a microlens, which may have a toroidal shape to direct light around the backside reflector. If desired, the toroidal lens may have a concave opening. Alternatively, the backside reflector may be ring-shaped, and a spherical microlens may focus light through a center portion of the reflector. A top surface of the silicon layer may be curved to focus light toward the center of the photosensitive region and improve pixel efficiency.

18 Claims, 9 Drawing Sheets

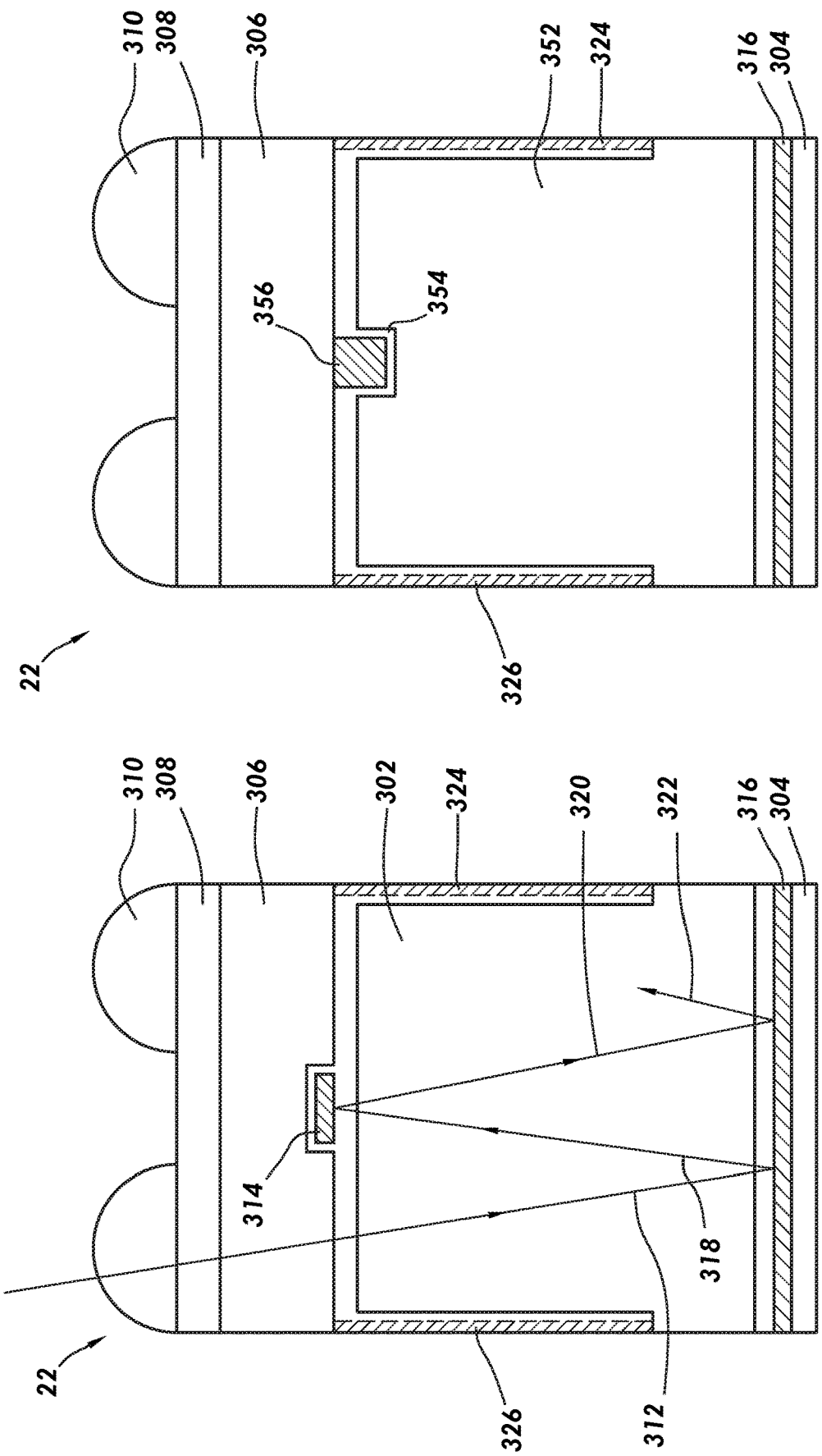

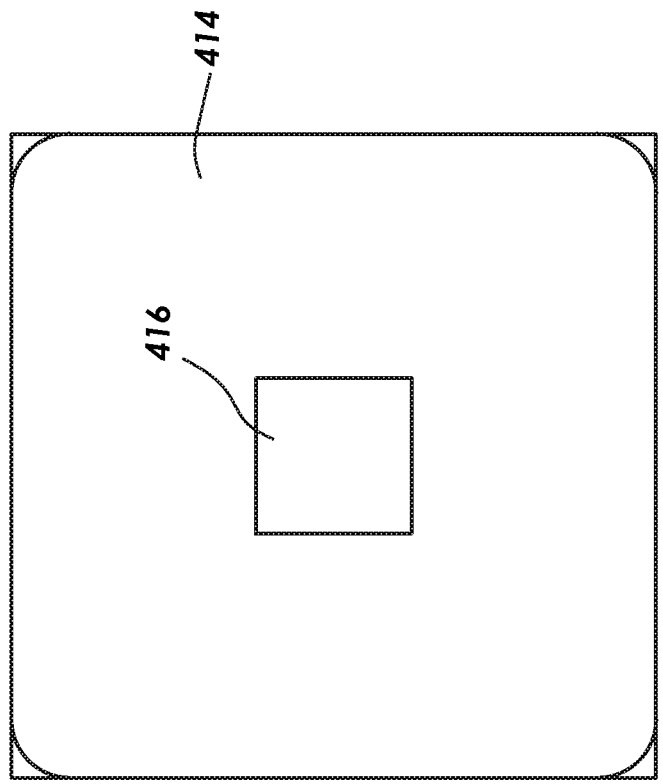
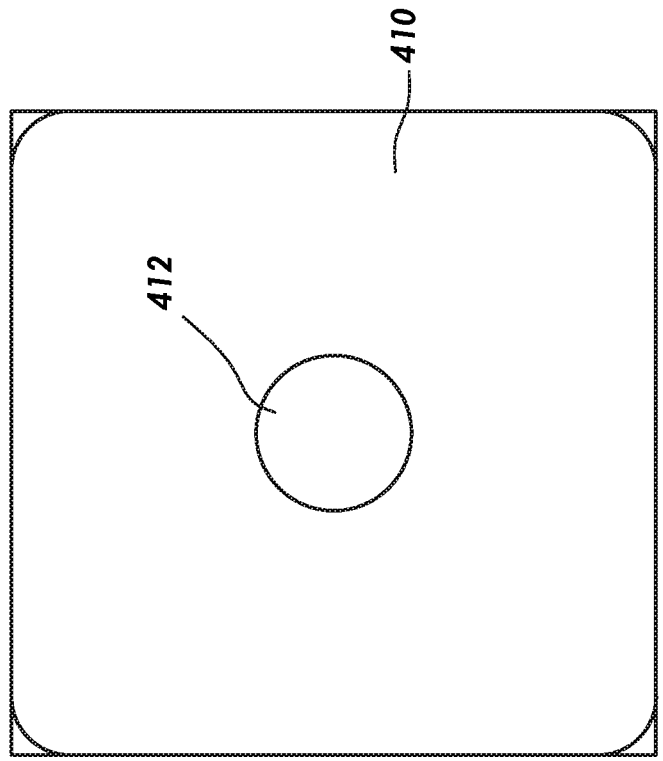
FIG.4B
FIG.4A

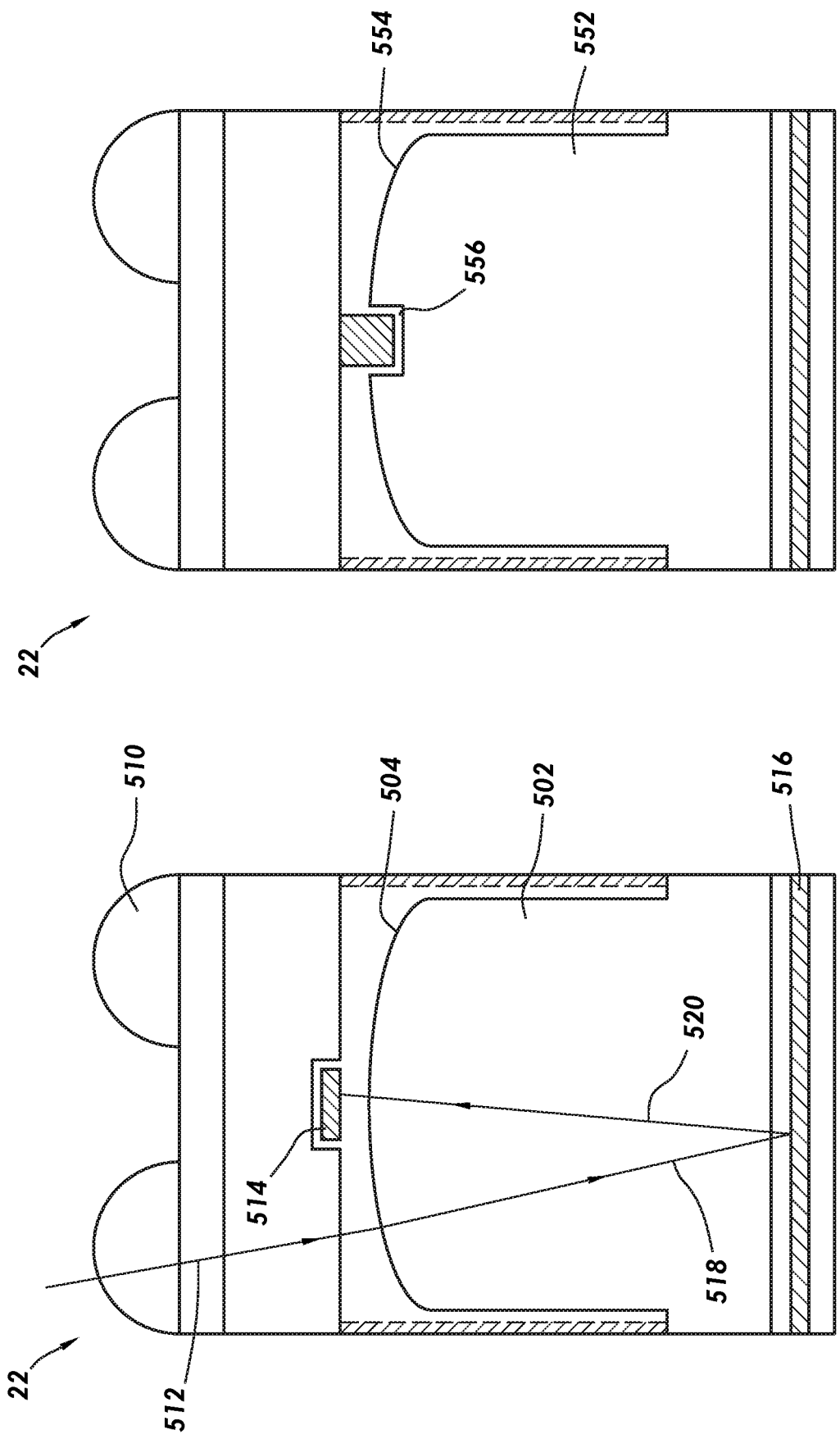

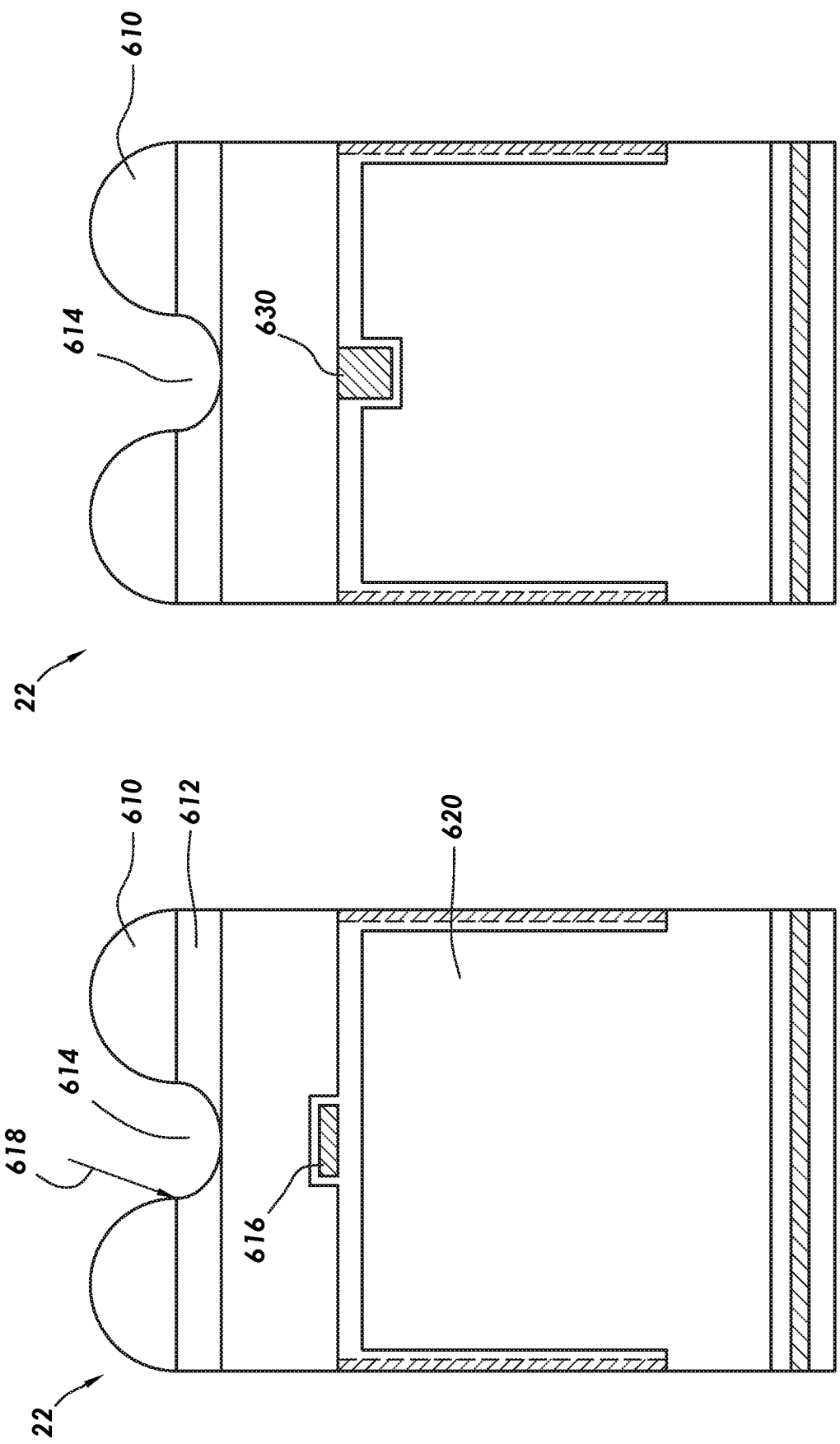

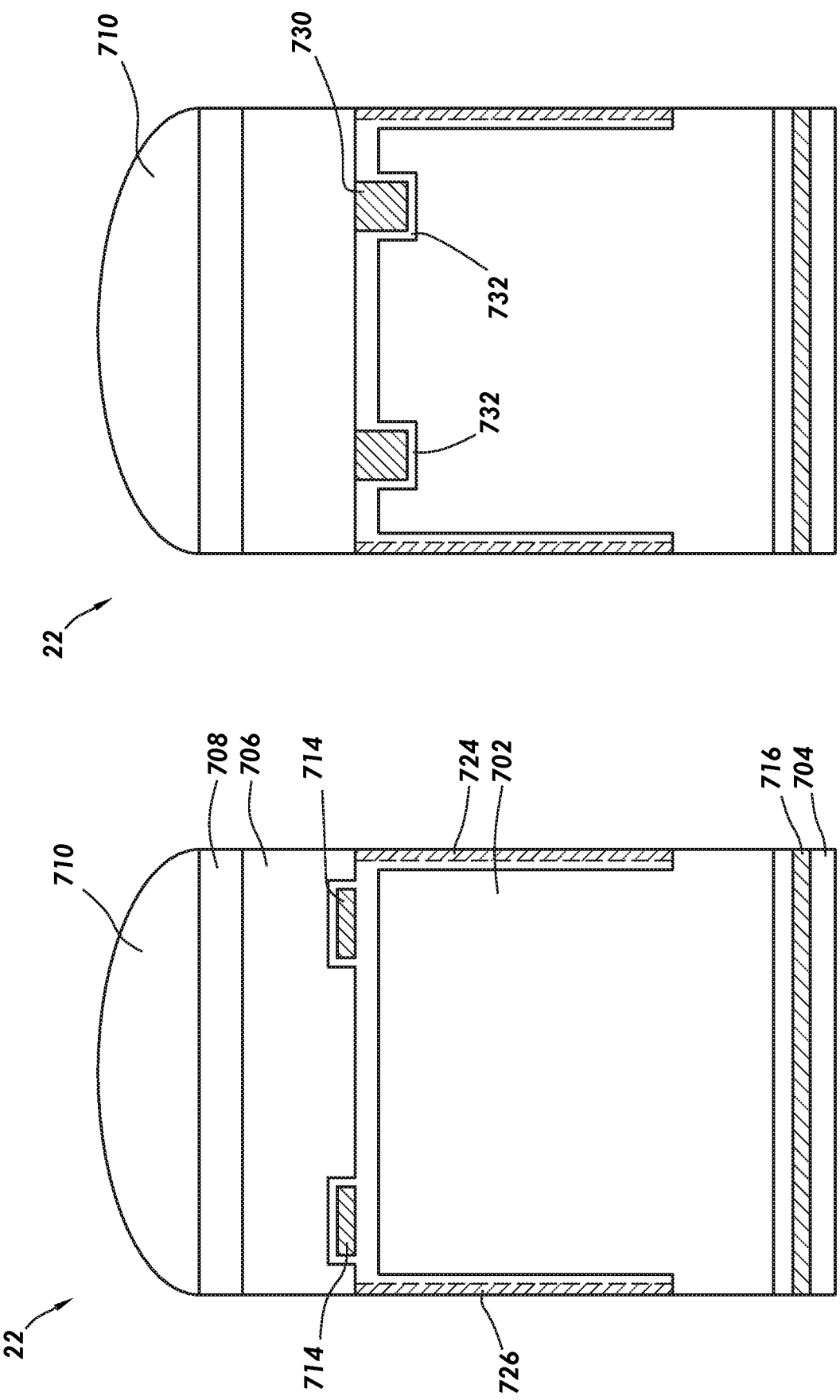

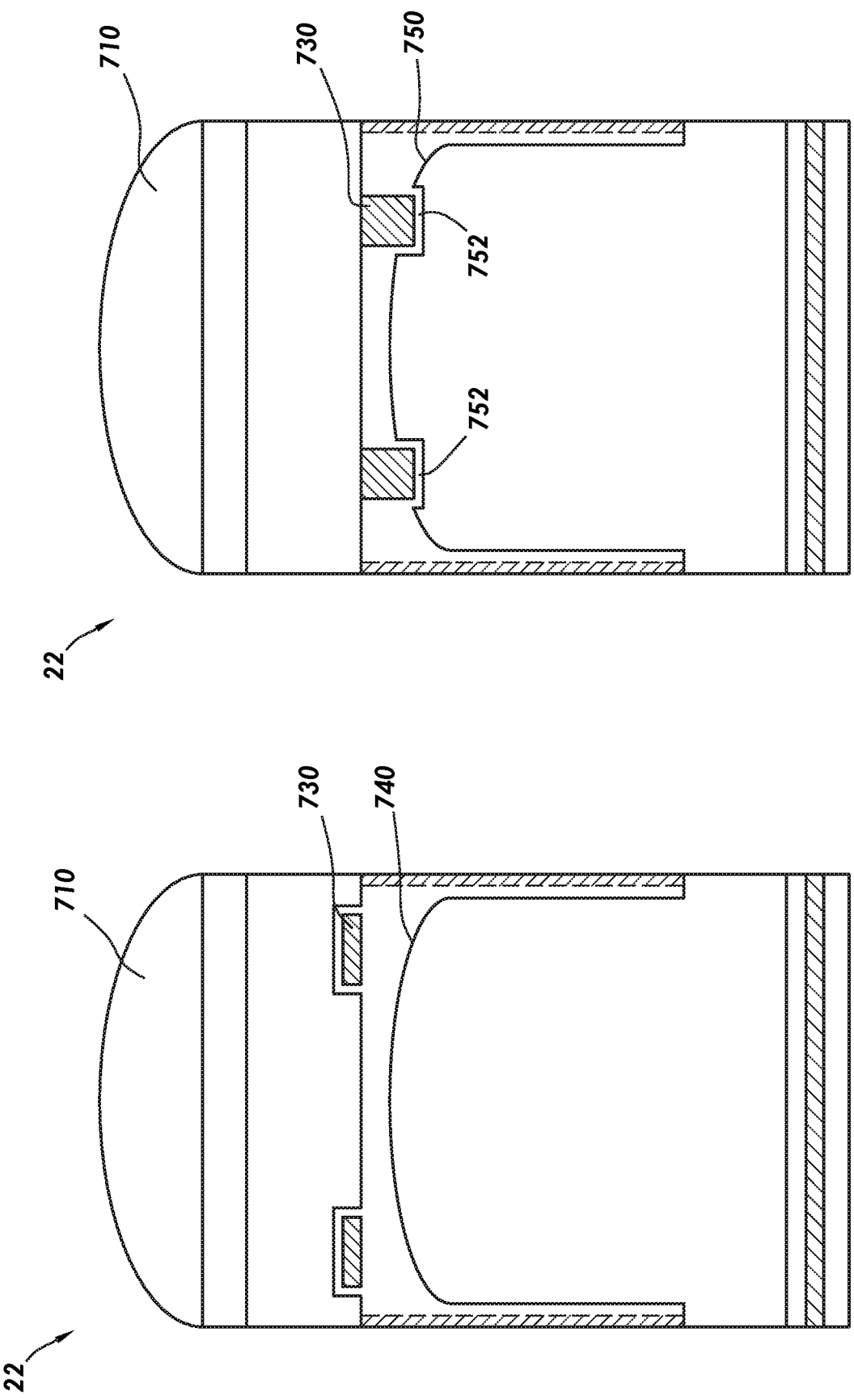

IMAGING SYSTEMS WITH IMPROVED NEAR-INFRARED DETECTION PIXELS

CROSS-REFERENCE TO RELATED APPLICATIONS

This application claims the benefit of U.S. Provisional Patent Application No. 62/832,043, filed on Apr. 10, 2019, the entire contents of which is incorporated herein by reference.

BACKGROUND

This relates generally to imaging devices, and more particularly, to imaging sensors that include pixels having improved detection at infrared and near-infrared wavelengths.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Each pixel receives incident photons (light) and converts the photons into electrical signals. Column circuitry is coupled to each pixel column for reading out pixel signals from the image pixels. Image sensors are sometimes designed to provide images to electronic devices using a Joint Photographic Experts Group (JPEG) format.

Image pixels commonly include microlenses that focus light incident on the array onto a photodetection region, which may be formed from a semiconductor material, such as silicon. The silicon may absorb photons of the light, which may then be converted into electrical signals. Absorption depth in silicon is a function of wavelength. Lower wavelength light (e.g. blue light) has a short absorption depth while long wavelength light (e.g. red light or near infrared light) have a long absorption depth. To detect long wavelength light, thick silicon is required. However, it is difficult to integrate thick silicon photodiodes in image sensors, especially Backside Illumination (BSI) image sensors. As a result, the image pixels may not accurately detect an amount of near-infrared or infrared light incident on the array.

It would therefore be desirable to provide imaging devices with image sensor pixels having improved detection at infrared and near-infrared wavelengths.

BRIEF DESCRIPTION OF THE DRAWINGS

FIG. 3A is a cross-sectional side view of an illustrative image pixel having a toroidal microlens and backside and frontside reflectors in accordance with an embodiment.

FIG. 3B is a cross-sectional side view of an illustrative image pixel having a toroidal microlens, a recessed backside reflector, and a frontside reflector in accordance with an embodiment.

FIG. 4A is a diagram of an illustrative toroidal microlens having a circular opening in accordance with an embodiment.

FIG. 4B is a diagram of an illustrative toroidal microlens having a square opening in accordance with an embodiment.

FIG. 5A is a cross-sectional side view of an illustrative image pixel having a toroidal microlens, backside and frontside reflectors, and a curved silicon lens in accordance with an embodiment.

FIG. 5B is a cross-sectional side view of an illustrative image pixel having a toroidal microlens, a recessed backside reflector, a frontside reflector, and a curved silicon lens in accordance with an embodiment.

FIG. 6A is a cross-sectional side view of an illustrative image pixel having a toroidal microlens, a concave opening, and backside and frontside reflectors in accordance with an embodiment.

FIG. 6B is a cross-sectional side view of an illustrative image pixel having a toroidal microlens, a concave opening, a recessed backside reflector, and a frontside reflector in accordance with an embodiment.

FIG. 7A is a cross-sectional side view of an illustrative image pixel having a spherical microlens, a backside reflector ring, and a frontside reflector in accordance with an embodiment.

FIG. 7B is a cross-sectional side view of an illustrative image pixel having a spherical microlens, a recessed backside reflector ring, and a frontside reflector in accordance with an embodiment.

FIG. 7C is a cross-sectional side view of an illustrative image pixel having a spherical microlens, a backside reflector ring, a frontside reflector, and a curved silicon lens in accordance with an embodiment.

FIG. 7D is a cross-sectional side view of an illustrative image pixel having a spherical microlens, a recessed backside reflector ring, a frontside reflector, and a curved silicon lens in accordance with an embodiment.

DETAILED DESCRIPTION

Embodiments of the present invention relate to image sensors, and more particularly, to image sensors having pixels with improved detection of infrared and near-infrared light. It will be recognized by one skilled in the art, that the present exemplary embodiments may be practiced without some or all of these specific details. In other instances, well known operations have not been described in detail in order to not unnecessarily obscure the present embodiments.

Imaging systems having digital camera modules are widely used in electronic devices such as digital cameras, computers, cellular telephones, and other electronic devices. A digital camera module may include one or more image sensors that gather incoming light to capture an image. Image sensors may include arrays of image pixels. The pixels in the image sensors may include photosensitive elements such as photodiodes that convert the incoming light into electric charge. Image sensors may have any number of pixels (e.g., hundreds or thousands or more). A typical image sensor may, for example, have hundreds, thousands, or millions of pixels (e.g., megapixels). Image sensors may include control circuitry such as circuitry for operating the image pixels and readout circuitry for reading out image signals corresponding to the electric charge generated by the photosensitive elements.

Image sensor pixels may be formed from semiconductor material, such as silicon, to absorb light incident on the pixels and convert the light into electrical current. In general, image sensor pixels may detect light at any desired wavelength and may generally be overlapped by a color filter to only pass light of a certain color to the underlying pixels. While conventional image sensor pixels may have silicon photosensitive regions that are effective at absorbing light at visible wavelengths, silicon is generally not as effective at absorbing infrared and near-infrared light (e.g., light at longer wavelengths than visible light). In other words, infrared light may need to travel through silicon for more time before being absorbed. As a result, the silicon in image sensor pixels configured to detect infrared and near-infrared light may need to be made thicker (in other words have a longer path length). For example, the silicon may need to be double the thickness, three times the thickness, or four times the thickness of a conventional image pixel. However, increasing the thickness of an image sensor pixel may increase the cost of producing the image sensor pixel and may degrade optical performance as overlying layers (such as a color filter layer) may be further from the photosensitive region due to integration limitations. Therefore, it may be desired to form image pixels that absorb sufficient infrared and near-infrared light (or light at other wavelengths that are longer than visible light) without increasing the thickness of the image pixels.

Figure 1:
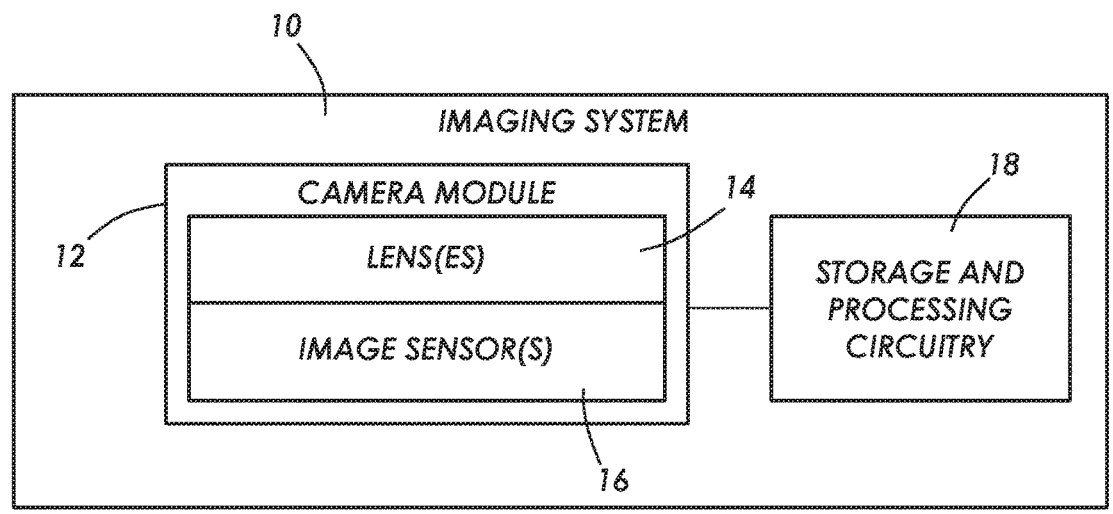
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
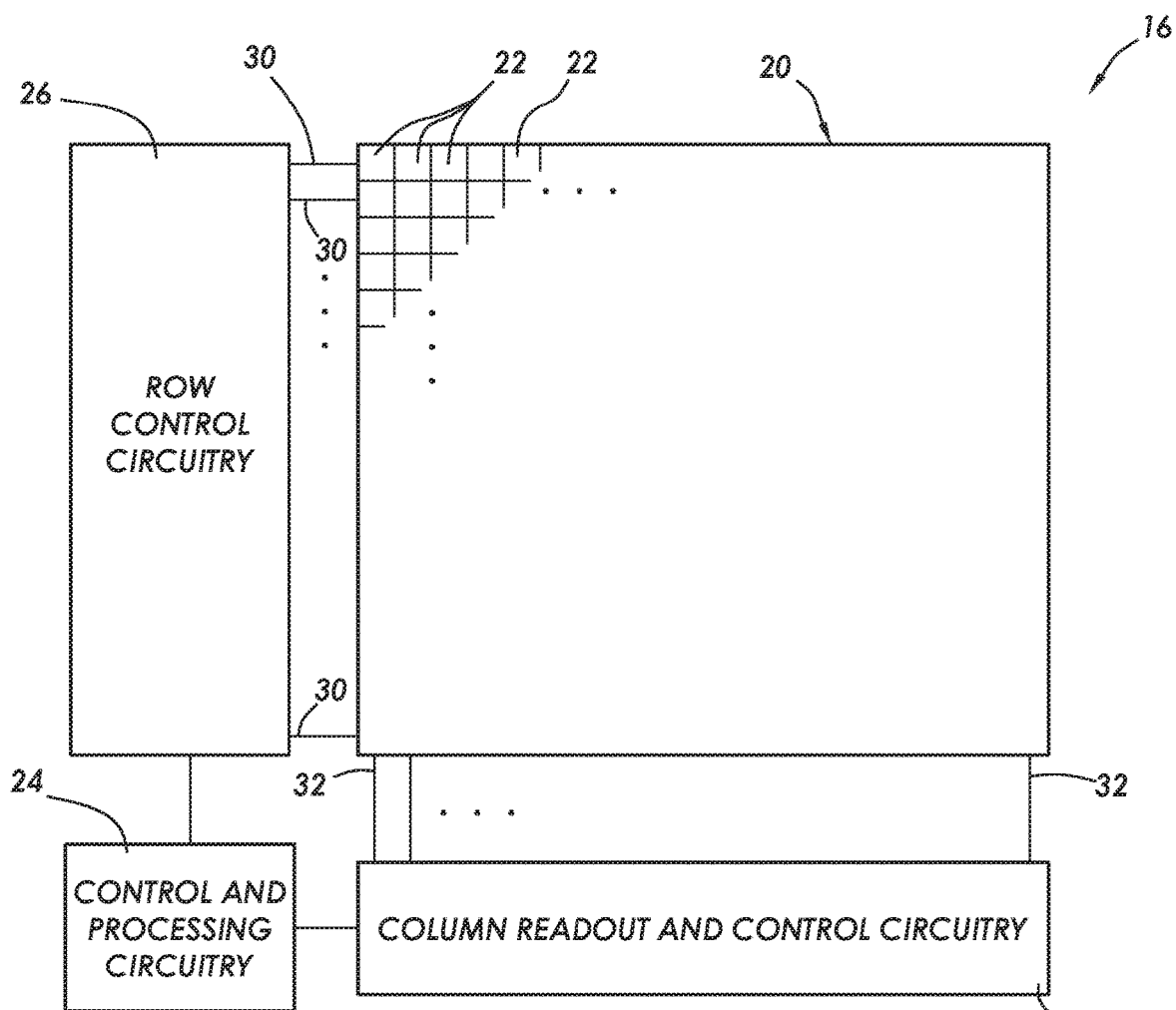
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 (sometimes referred to as column readout and control circuitry 28) may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Image sensor 16 may be configured to support a global shutter operation (e.g., pixels 22 may be operated in a global shutter mode). For example, the image pixels 22 in array 20 may each include a photodiode, floating diffusion region, and local charge storage region. With a global shutter scheme, all of the pixels in the image sensor are reset simultaneously. A charge transfer operation is then used to simultaneously transfer the charge collected in the photodiode of each image pixel to the associated charge storage region. Data from each storage region may then be read out on a per-row basis, for example.

Image pixels 22 in array 20 may include structures that allow for enhanced absorption at infrared and near-infrared wavelengths (or other wavelengths that are longer than visible light wavelengths). As shown in FIG. 3A, pixel 22 may be formed from epitaxial layer 302 and interlayer dielectric 304, which is formed on a surface of epitaxial layer 302. In general, epitaxial layer 302 may be formed from any desired semiconductor material, such as silicon. Epitaxial layer 302 may also be referred to as a semiconductor layer, a silicon layer, and a photosensitive region herein. An optical stack may be formed over epitaxial layer 302 and may include color filter 306, planarization layer 308, and microlens 310. Color filter 306 may be formed from color filter resist, which may include any desired pigments, on a transparent substrate. Microlens 310 may be formed from acrylic, glass, polymer, or any other desired material. Planarization layer 308 may be a dielectric layer, and may be organic or inorganic, as examples.

Microlens 310 may focus light incident on pixel 22 (shown as incident light 312) onto epitaxial layer 302. Epitaxial layer 302 may absorb the light, which may then be converted by pixel 22 into electrical charge that is representative of the amount of light incident on pixel 22. As previously discussed, silicon may not be able to absorb light at wavelengths longer than visible light wavelengths (e.g., infrared and near-infrared light) as effectively as visible light. Therefore, reflector structures may be incorporated into pixel 22.

As shown in FIG. 3A, pixel 22 may include backside reflector 314 and frontside reflector 316. However, this arrangement is merely illustrative. Pixel 22, although shown in a backside configuration, may instead be formed in a frontside configuration. Frontside reflector 316 may reflect incident light 312 when it reaches the frontside of epitaxial layer 302. Reflected light 318 may then pass back through epitaxial layer 302 until it reaches the backside of epitaxial layer 302. At that point, the light may be reflected back into epitaxial layer 302 by backside reflector 314, as shown by reflected light 320. This light may travel through epitaxial layer until it again reaches frontside reflector 316 to be reflected as reflected light 322.

As illustrated by incident light 312, reflected light 318, reflected light 320, and reflected light 322, at least some of the light incident on pixel 22 may pass completely through epitaxial layer 302 four times. In other words, the light may traverse the silicon of the photosensitive region multiple times, thereby allowing the light more time to be absorbed by the silicon and giving the silicon an effective thickness that is four times the physical thickness of the layer. The greater effective thickness of silicon layer 302 may allow for greater absorption of light with longer wavelengths than visible light, such as infrared and near-infrared light. In general, the addition of reflectors, such as backside reflector 314 and frontside reflector 316, into pixel 22 allows for increased absorption of incident light without increasing the physical thickness of the silicon layer. This may allow the thickness of the silicon layer to be 3 microns or less, 5 microns or less, more than 4 microns, or 10 microns or less, as examples. In general, the use of backside and frontside reflectors may increase the effective thickness of a silicon layer having any desired physical thickness.

Backside reflector 314 and frontside reflector 316 may be formed from a metal or an alloy of metals, such as tungsten, aluminum, titanium, titanium nitride, tantalum, or tantalum nitride. However, this is merely illustrative. In general, the reflectors may be formed from any desired materials, such as ceramic, polymer, other metals, or composite materials. Moreover, although reflectors 314 and 316 have been illustrated as being planar and having square/rectangular shapes, backside reflector 314 and/or frontside reflector 316 may alternatively be curved and/or have any desired shape. For example, backside reflector 314 and/or frontside reflector 316 may be circular or polygonal, as examples. In general, reflectors 314 and 316 may be formed from any desired materials or have any desired shape/orientation to reflect light as desired within pixel 22.

If desired, pixel 22 may further include optional reflectors 324 and 326. As shown in FIG. 3A, optional reflectors 324 and 326 may be backside deep trench isolation structures. In other words, reflectors 324 and 326 may extend from the backside surface into silicon layer 302. Reflectors 324 and 326 may redirect light that reaches an edge of silicon layer 302 back into the silicon layer, thereby increasing absorption of the light and reducing crosstalk between neighboring pixels. Reflectors 324 and 326 may be formed from any desired material (which may be the same as or different from the materials used to form one or both of backside reflector 314 and frontside reflector 316), and may be metal filled or non-metal filled. Although reflectors 324 and 326 have been illustrated as partially extending into silicon layer 302, this is merely illustrative. In general, reflectors 324 and 326 may extend fully through or partially through silicon layer 302. Moreover, reflectors 324 and 326 may alternatively be formed as frontside deep trench isolation structures, extending from the frontside surface into silicon layer 302, if desired.

Although backside reflector 314 is shown in FIG. 3A as being applied on color filter 306 and as being above silicon layer 302, a recess may be formed in silicon layer 302 to accommodate at least a portion of the backside reflector, if desired.

As shown in FIG. 3B, pixel 22 may include silicon layer 352, a portion of which may form recess 354. At least a portion of backside reflector 356 may be formed in recess 354. This may allow for pixel 22 to have a smaller physical thickness and may allow for color filter 306 to have a constant thickness (as opposed to color filter 306 of FIG. 3A, which may have a recessed portion to accommodate backside reflector 314), as examples. In general, recess 354 may have any desired size and shape to accommodate any desired backside reflector. For example, backside reflector 356 may be curved, and recess 354 may have a matching curved shape. Recess 354 may extend into less than 5% of the thickness of layer 352, less than 10% of the thickness of layer 352, less than 20% of the thickness of layer 352, greater than 15% of the thickness of layer 352, or less than 50% of the thickness of layer 352. In general, recess 354 may extend as far into layer 352 as desired, and may be adjusted as necessary to accommodate backside reflector 356. Backside reflector 356 may be formed from the same materials as backside reflector 314 of FIG. 3A, if desired.

Pixel 22 may further include color filter 306, planarization layer 308, microlens 310, interlayer dielectric 304, frontside reflector 316, and optional reflectors 324 and 326. These features may be the same as described above in connection with FIG. 3A. Although not shown in FIG. 3B, backside reflector 356 and frontside reflector 316 may reflect light within silicon layer 352 to increase the effective thickness of the silicon layer and thereby increase the absorption of light within the layer. In particular, at least some of the light incident on pixel 22 may travel through silicon layer 352 twice, three times, or four times, as examples.

As shown in FIGS. 3A and 3B, microlens 310 may overlay respective silicon layers 302 and 352 to focus light into the silicon layers. In the arrangement shown in FIGS. 3A and 3B, microlens 310 may be arranged to direct light around backside reflector 314/356. In particular, microlens 310 may have a toroidal shape to ensure that light is not directed toward the backside reflector (e.g., the light may instead be directed between the backside reflector and the edge of the silicon layer). However, the use of a toroidal microlens is merely illustrative. In general, a microlens of any shape may be used. In general, the microlenses used in pixels having a backside reflector may direct light away from/around the backside reflector.

Top views of illustrative toroidal lenses that may be used in pixel 22 are shown in FIGS. 4A and 4B. As shown in FIG. 4A, toroidal microlens 410 may have a square shape, which may match the shape of an underlying image pixel, and may have a circular opening 412 in the center of the lens. Circular opening 412 may allow microlens 410 to direct light toward edge regions of an underlying image pixel, rather than the center region. This may be beneficial when using a backside reflector, such as backside reflectors 314 and 356 of FIG. 3, as the light may be directed around the backside reflector and into the silicon photosensitive region of the underlying image pixel.

Another illustrative toroidal microlens is shown in FIG. 4B. Toroidal microlens 414 may have square opening 416, rather than the circular opening of microlens 410 of FIG. 4A. However, toroidal microlenses 410 and 414 are merely illustrative. In general, toroidal microlenses over pixel 22 may have any desired shape and may have any desired opening to direct light around a backside reflector. In some cases, it may be desired to have an opening in the toroidal microlens that has a shape matching a shape of the underlying backside reflector. However, this is not limiting. In general, any desired microlens with any desired opening may be used in pixel 22.

Although using a toroidal microlens may direct light around a backside reflector, some light may still be lost after it is reflected by the frontside reflector. For example, some of reflected light 318 of FIG. 3A may not be directed toward backside reflector 314. As a result, this light may exit the top of silicon layer 302 and not be absorbed by the silicon for detection. Therefore, it may be desirable to focus incident light on the center of the frontside reflector, which may, in turn, result in more reflected light reaching the backside reflector.

As shown in FIG. 5A, the top surface of silicon layer 502 may be curved to form silicon lens 504. In particular, silicon lens 504 may be shaped to focus light toward the center of silicon layer 502. As shown, incident light 512 may pass through toroidal lens 510, which may ensure that the light is focused between backside reflector 514 and the edge of silicon layer 502 (e.g., to ensure that the light is not focused onto the top surface of backside reflector 514) and into the silicon. At this point, silicon lens 504 may redirect the light toward the center of the silicon layer, as shown by redirected light 518. Redirected light 518 may be reflected off of frontside reflector 516 as reflected light 520. Because of the incorporation of silicon lens 504, more light may be focused toward the center of silicon layer 502 and, in turn, may be focused on backside reflector 514 after being reflected by frontside reflector 516. This may reduce the amount of light that is reflected by frontside reflector 516, only to miss backside reflector 514 and exit through the top of the silicon layer. Although silicon lens 504 has been illustrated as a spherical shape, this is merely illustrative. In general, silicon lens 504 may be shaped in any desired manner to focus light as desired within pixel 22.

FIG. 5B shows silicon lens 554 incorporated with a recessed backside reflector arrangement. In particular, the top surface of silicon layer 552 may be curved into silicon lens 554 at side portions of the silicon layer, while recess 556 may be formed in the top surface at the center of the silicon layer. In general, this arrangement may reduce the physical thickness of the optical stack overlying image pixel 22 and may ensure that the color filter has a constant thickness.

If desired, other components of pixels 22 shown in FIGS. 5A and 5B, including a microlens, planarization layer, interlayer dielectric, and optional reflectors, may be the same as those shown in FIGS. 3A and 3B. However, this is merely illustrative. In general, one or more of the optical layers overlying pixel 22 may be adjusted. In particular, with the addition of silicon lenses 504/554, it may be desired to change the curvature of the overlying microlens (such as microlens 510 of FIG. 5A), the thickness of the overlying color filter, or the thickness of the silicon layer 502/552. However, any properties may be selected for each of these layers to ensure that incident light is properly focused within pixel 22.

In some cases, although the toroidal microlenses described above in connection with FIGS. 3-5 may be shaped to direct light away from the backside reflector (e.g., away from the center of the silicon layer), it may be desired to further shape the lens further to improve the directionality of the focused light.

As shown in FIG. 6A, pixel 22 may be overlapped by microlens 610 and planarization layer 612. Microlens 610 may be a toroidal microlens, which may focus incident light around backside reflector 616 (e.g., rather than directing the light onto a top surface of reflector 616). As previously described, this may increase an amount of light that reaches the silicon of pixel 22 for detection. Additionally, as shown in FIG. 6A, toroidal microlens 610 and planarization layer 612 may have a concave opening 614. Concave opening 614 may further direct light away from the center region of pixel 22, especially with regards to light incident on an edge portion of microlens 610, such as incident light 618. In this case, concave opening may increase the amount of light that reaches silicon layer 620, rather than being directed out of the pixel entirely.

Figure 6D:
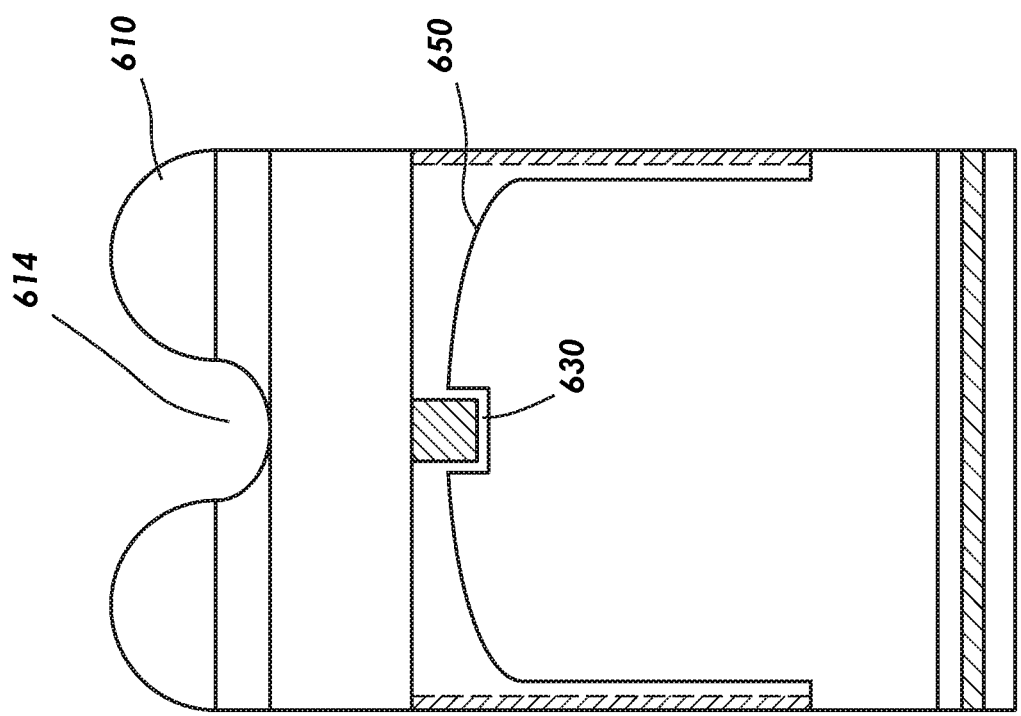
FIG. 6D is a cross-sectional side view of an illustrative image pixel having a toroidal microlens, a concave opening, a recessed backside reflector, a frontside reflector, and a curved silicon lens in accordance with an embodiment.
Figure 6C:
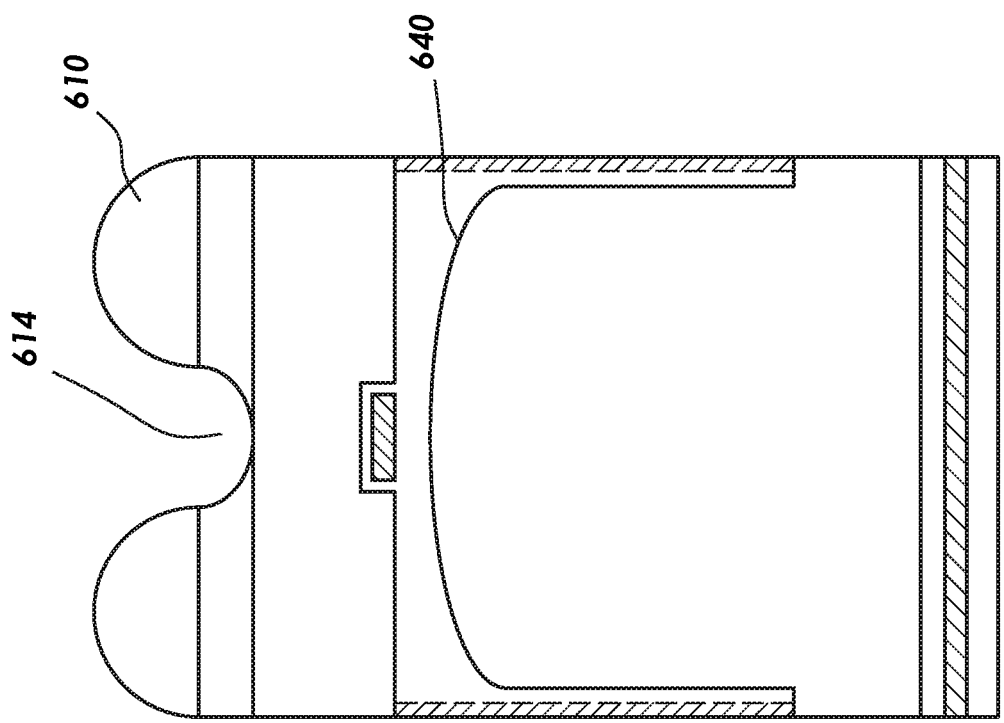
FIG. 6C is a cross-sectional side view of an illustrative image pixel having a toroidal microlens, a concave opening, backside and frontside reflectors, and a curved silicon lens in accordance with an embodiment.

As shown in FIGS. 6B-6D, toroidal microlens 610 with concave opening 614 may be applied over pixel 22 having backside reflector 630 recessed within the silicon layer (FIG. 6B), may be applied over silicon lens 640 (FIG. 6C), or may be applied over silicon lens 650 having a recess to accommodate backside reflector 630 (FIG. 6D). Each of FIG. 6A may include the optical and reflector layers described above in connection with FIGS. 3-5, including, but not limited to, a color filter, a frontside reflector, and optional side reflectors.

Although each of the pixels illustrated in FIGS. 3-6 may have backside reflectors in a single location and toroidal microlenses, this is merely illustrative. In general, any desired backside reflector shape, size, and orientation may be used, and a corresponding microlens may overlap the backside reflector to direct light around the reflector and into the underlying silicon layer.

As shown in FIG. 7A, pixel 22 may include a ring-shaped backside reflector 714. Ring-shaped backside reflector 714 may form a ring around the periphery of underlying silicon layer 702. Because ring-shaped backside reflector 714 is located at the periphery, instead of at the center, of pixel 22, spherical microlens 710 may be used instead of a toroidal microlens. In particular, spherical microlens 710 may focus light toward the center of pixel 22 and the center of ring-shaped backside reflector 714. In this way, light incident on pixel 22 may pass through the center of the backside reflector and be reflected by frontside reflector 716. Pixel 22 may include the other layers described above in connection with FIGS. 3-6, if desired. These layers may include, but are not limited to, planarization layer 708, color filter 706, optional reflectors 724 and 726, and interlayer dielectric 704.

Ring-shaped backside reflector 714 may have planar upper and lower surfaces as shown in FIG. 7A, or the reflector may have curved surfaces (e.g., concave or convex surfaces). Moreover, ring-shaped backside reflector 714 may have a circular ring-shape, a rectangular ring-shape, or any other desired ring-shape. Ring-shaped backside reflector 714 may be formed from a metal or an alloy of metals, such as tungsten, aluminum, titanium, titanium nitride, tantalum, or tantalum nitride. However, this is merely illustrative. In general, the reflectors in pixel 22 may be formed from any desired materials, such as ceramic, polymer, other metals, or composite materials.

A ring-shaped backside reflector and spherical microlens may be incorporated into any of the arrangements previously discussed. In particular, as shown in FIGS. 7B-7D, ring-shaped backside reflector 730 may be accommodated by recess 732 in the silicon layer (FIG. 7B), may overlap silicon lens 740 (FIG. 7C), or may be accommodated by recesses 752 in silicon lens 750 (FIG. 7D).

While pixel 22 has been shown having spherical microlens 710 in each of FIGS. 7A-7D, this is merely illustrative. Any desired microlens may overlap a pixel having a ring-shaped backside reflector. In general, the microlens may be chosen and configured to direct light through the center of the underlying ring-shaped microlens to ensure that light reaches the underlying silicon layer for detection by pixel 22.

In general, any desired pixels 22 within an array of image pixels (such as array 20 of FIG. 2) may include backside and frontside reflectors, such as those described in connection with FIGS. 3-7. If desired, all of the pixels may include backside and frontside reflectors, every other pixel may include backside and frontside reflectors, or one in four pixels may include backside and frontside reflectors, as examples. In one example, it may be desired to have some pixels within an array of pixels configured to detect light at infrared and/or near-infrared wavelengths. Other pixels within the array of pixels may detect light at visible wavelengths. The pixels configured to detect light at infrared/near-infrared wavelengths may include backside and frontside reflectors, while the pixels configured to detect visible light may not include the reflectors. An example of this arrangement is shown in FIG. 8.

Figure 8:
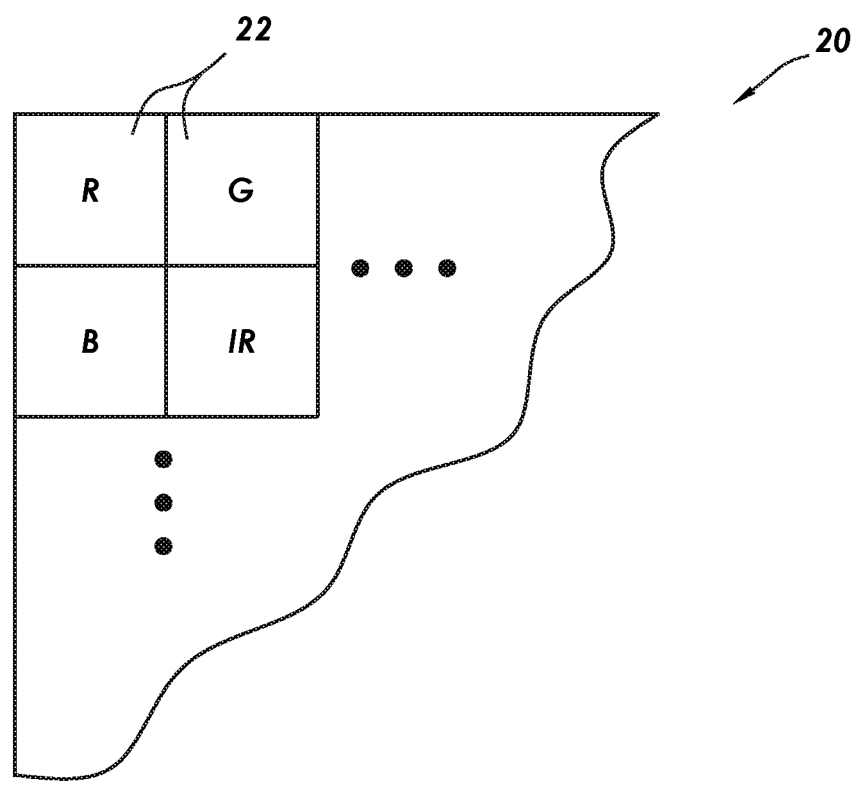
FIG. 8 is a diagram of an illustrative array of image sensor pixels having a repeating unit cell of red, green, blue, and infrared image pixels.

As shown in FIG. 8, image pixel array 20 may include repeating two-by-two unit cells of pixels. Each two-by-two cell may include a pixel configured to generate charge in response to red light (a red image pixel), a pixel configured to generate charge in response to green light (a green image pixel), a pixel configured to generate charge in response to blue light (a blue image pixel), and a pixel configured to generate charge in response to infrared light (an infrared pixel). In this arrangement, the infrared pixels in array 20 may include backside and frontside reflectors to increase the effective thicknesses of the pixels, while the red, green, and blue pixels may not have backside and/or frontside reflectors. Alternatively, the infrared pixels and the green pixels may include backside and frontside reflectors, while the red and blue pixels may not backside and/or frontside reflectors. However, this arrangement is merely illustrative. In general, pixel array 20 may have image pixels that are configured to generate charge in response to any desired wavelengths and that are arranged in any desired pattern. Moreover, any desired image pixels within array 20 may include backside and/or frontside reflectors to increase the effective thicknesses of the pixels.

In accordance with various embodiments, an image sensor pixel may be configured to generate charge in response to incident light and may include a semiconductor layer having opposing first and second surfaces, and the incident light may pass through the first surface. The image sensor pixel may also include first and second reflectors, with the semiconductor layer interposed between the first and second reflector, and a microlens that directs light into the semiconductor layer.

In accordance with an embodiment, the image sensor pixel may further include a color filter interposed between the first surface of the semiconductor layer and the microlens, and the first reflector may be a backside reflector. A portion of the first surface of the semiconductor may form a recess and at least a portion of the backside reflector may extend into the recess, if desired.

In accordance with an embodiment, the image sensor pixel may further include a dielectric layer coupled to the second surface of the semiconductor layer, and the second reflector may be a frontside reflector embedded in the dielectric layer. In some embodiments, the microlens may be a toroidal microlens and the toroidal microlens may be configured to direct the light around the backside reflector and into the semiconductor layer. The image sensor pixel may further include a planarization layer between the toroidal microlens and the color filter. The planarization layer may have an opening, and the opening in the planarization layer and a central opening in the toroidal microlens may form a concave structure to focus light around the backside reflector and into the semiconductor layer, if desired. In some embodiments, the backside reflector may be a ring-shaped backside reflector and the microlens may be a spherical microlens that is configured to direct the light through a center portion of the ring-shaped backside reflector and into the semiconductor layer.

In accordance with an embodiment, the image sensor pixel may further include third and fourth reflectors formed on side surfaces of the semiconductor layer. The third and fourth reflectors may be backside deep trench isolation reflectors or frontside deep trench isolation reflectors. The third and fourth reflectors may extend completely or partially through the semiconductor layer.

In accordance with an embodiment, the first and second reflectors may be formed from tungsten, aluminum, titanium, titanium nitride, tantalum, tantalum nitride, ceramic, or polymer. The semiconductor layer may be formed from silicon, and the first surface of the semiconductor layer may be curved to form a silicon lens that is configured to focus light toward the center of the silicon layer. The silicon lens may have a portion that forms a recess and at least a portion of the first reflector may extend into the recess, if desired.

In accordance with various embodiments, an array of image sensor pixels may be configured to generate charge in response to incident light and may include first image sensor pixels that are configured to generate charge in response to light of a first color, second image sensor pixels that are configured to generate charge in response to light of a second color, and infrared image sensor pixels that are configured to generate charge in response to infrared light. The infrared image sensor pixels may include a semiconductor layer having opposing first and second surfaces, a frontside reflector and a backside reflector, and a microlens that overlaps the semiconductor layer, the frontside reflector, and the backside reflector and that is configured to direct light into the semiconductor layer. Incident light may pass through the first surface of the semiconductor layer, and the semiconductor layer may be interposed between the frontside reflector and the backside reflector.

In accordance with an embodiment, the array of image sensor pixels may further include third image sensor pixels that are configured to generate charge in response to light of a third color. The first, second, third, and infrared image sensor pixels may be arranged in a two-by-two unit cell that repeats across the array of image sensor pixels. The first, second, and third colors may be visible colors, and at least one of the first, second, and third image sensor pixels may not have frontside and/or backside reflectors. The first color may be red, the second color may be blue, and the third color may be green, as examples.

In accordance with an embodiment, the semiconductor layer may be a silicon layer and the first surface of the silicon layer may be curved to form a lens that directs light toward a center portion of the silicon layer.

In accordance with an embodiment, each of the first and second image sensor pixels may include a semiconductor layer and the semiconductor layers of the first, second, and infrared image sensor pixels may be less than five microns thick.

In accordance with various embodiments, an image sensor pixel may be configured to generate charge in response to infrared light and may include a photosensitive region having opposing first and second surfaces, a toroidal microlens overlapping the photosensitive region, a first reflector interposed between the toroidal microlens and the first surface of the photosensitive region, and a second reflector adjacent to the second surface of the photosensitive region.

In accordance with an embodiment, the photosensitive region may further include edge surfaces that extend from the first surface to the second surface, and the image sensor pixel may further include third and fourth reflectors on at least some of the edge surfaces of the photosensitive region.

In accordance with an embodiment, the first surface of the photosensitive region may be curved to form a lens that is configured to direct light toward a center portion of the photosensitive region.

The foregoing is merely illustrative and various modifications can be made to the described embodiments. The foregoing embodiments may be implemented individually or in any combination.

What is claimed is:

1. An image sensor pixel configured to generate charge in response to incident light, the image sensor pixel comprising:
    a semiconductor layer having opposing first and second surfaces, wherein the incident light passes through the first surface, wherein the semiconductor layer is formed from silicon, and wherein the first surface of the silicon layer is curved to form a silicon lens that is configured to focus light toward a center portion of the silicon layer;
    first and second reflectors, wherein the semiconductor layer is interposed between the first and second reflectors; and
    a microlens that is configured to direct light into the semiconductor layer.

2. The image sensor pixel defined in claim 1 further comprising a color filter interposed between the first surface of the semiconductor layer and the microlens, wherein the first reflector is a backside reflector.

3. The image sensor pixel defined in claim 2 wherein a portion of the first surface of the semiconductor forms a recess and wherein at least a portion of the backside reflector extends into the recess.

4. The image sensor pixel defined in claim 2 further comprising a dielectric layer coupled to the second surface of the semiconductor layer, wherein the second reflector is a frontside reflector embedded in the dielectric layer.

5. The image sensor pixel defined in claim 4 wherein the microlens is a toroidal microlens and wherein the toroidal microlens is configured to direct the light around the backside reflector and into the semiconductor layer.

6. The image sensor pixel defined in claim 5 further comprising a planarization layer between the toroidal microlens and the color filter, wherein the planarization layer has an opening, and wherein the opening in the planarization layer and a central opening in the toroidal microlens form a concave structure to focus light around the backside reflector and into the semiconductor layer.

7. The image sensor pixel defined in claim 4 wherein the backside reflector is a ring-shaped backside reflector and wherein the microlens is a spherical microlens that is configured to direct the light through a center portion of the ring-shaped backside reflector and into the semiconductor layer.

8. The image sensor pixel defined in claim 1 further comprising:
    third and fourth reflectors formed on side surfaces of the semiconductor layer, wherein the third and fourth reflectors are selected from the group consisting of: backside deep trench isolation reflectors and frontside deep trench isolation reflectors.

9. The image sensor pixel defined in claim 1 wherein the first and second reflectors are formed from material selected from the group consisting of: tungsten, aluminum, titanium, titanium nitride, tantalum, tantalum nitride, ceramic, and polymer.

10. The image sensor pixel defined in claim 1 wherein the silicon lens has a portion that forms a recess and wherein at least a portion of the first reflector extends into the recess.

11. An array of image sensor pixels that are configured to generate charge in response to incident light, the array of image sensor pixels comprising:
    first image sensor pixels that are configured to generate charge in response to light of a first color;
    second image sensor pixels that are configured to generate charge in response to light of a second color;

infrared image sensor pixels that are configured to generate charge in response to infrared light, wherein each of the infrared image sensor pixels comprises:
    a semiconductor layer having opposing first and second surfaces, wherein the incident light passes through the first surface,
    a frontside reflector and a backside reflector, wherein the semiconductor layer is interposed between the frontside reflector and the backside reflector, and
    a microlens that overlaps the semiconductor layer, the frontside reflector, and the backside reflector and that is configured to direct light into the semiconductor layer; and
    third image sensor pixels that are configured to generate charge in response to light of a third color, wherein the first, second, third, and infrared image sensor pixels are arranged in a two-by-two unit cell that repeats across the array of image sensor pixels.

12. The array of image sensor pixels defined in claim 11 wherein at least one of the first, second, and third image sensor pixels do not have backside reflectors.

13. The array of image sensor pixels defined in claim 12 wherein the first color is red, the second color is blue, and the third color is green.

14. The array of image sensor pixels defined in claim 11 wherein the semiconductor layer is a silicon layer and wherein the first surface of the silicon layer is curved to form a lens that directs light toward a center portion of the silicon layer.

15. The array of image sensor pixels defined in claim 11 wherein each of the first and second image sensor pixels comprises a semiconductor layer and wherein the semiconductor layers of the first, second, and infrared image sensor pixels are less than five microns thick.

16. An image sensor pixel that is configured to generate charge in response to infrared light, the image sensor pixel comprising:
    a photosensitive region having opposing first and second surfaces, wherein a portion of the first surface of the photosensitive region forms a recess;
    a toroidal microlens overlapping the photosensitive region;
    a first reflector interposed between the toroidal microlens and the first surface of the photosensitive region, wherein at least a portion of the first reflector extends into the recess; and
    a second reflector adjacent to the second surface of the photosensitive region.

17. The image sensor pixel defined in claim 16 wherein the photosensitive region further comprises edge surfaces that extend from the first surface to the second surface, the image sensor pixel further comprising:
    third and fourth reflectors on at least some of the edge surfaces of the photosensitive region.

18. The image sensor pixel defined in claim 16 wherein the first surface of the photosensitive region is curved to form a lens that is configured to direct light toward a center portion of the photosensitive region.

\* \* \* \* \*